United States Patent
Wu

(10) Patent No.: US 6,294,416 B1
(45) Date of Patent: Sep. 25, 2001

(54) METHOD OF FABRICATING CMOS TRANSISTORS WITH SELF-ALIGNED PLANARIZATION TWIN-WELL BY USING FEWER MASK COUNTS

(75) Inventor: Shye-Lin Wu, Hsinchu (TW)

(73) Assignee: Texas Instruments-Acer Incorporated (TW)

( * ) Notice: Subject to any disclaimer, the term of this patent is extended or adjusted under 35 U.S.C. 154(b) by 0 days.

(21) Appl. No.: 09/307,629

(22) Filed: May 7, 1999

Related U.S. Application Data

(63) Continuation-in-part of application No. 09/013,424, filed on Jan. 23, 1998.

(51) Int. Cl.$^7$ ................................................ H01L 21/8238
(52) U.S. Cl. ........................ 438/199; 438/217; 438/228; 438/231
(58) Field of Search .................................. 438/199, 217, 438/228, 231, 282, 276, 473, 232, 238

(56) References Cited

U.S. PATENT DOCUMENTS

| | | | |
|---|---|---|---|
| 4,584,027 | * 4/1986 | Metz, Jr. et al. | 148/1.5 |
| 4,906,588 | * 3/1990 | Harrington, III | 437/44 |
| 5,130,268 | * 7/1992 | Liou et al. | 437/67 |
| 5,278,441 | * 1/1994 | Kang et al. | 257/371 |
| 5,320,975 | * 6/1994 | Cederbaum et al. | 437/44 |
| 5,573,963 | * 11/1996 | Sung | 437/34 |
| 5,576,570 | * 11/1996 | Ohsawa et al. | 257/369 |
| 5,606,191 | * 2/1997 | Wang | 257/336 |
| 5,650,341 | * 7/1997 | Yang et al. | 437/34 |
| 5,736,415 | * 4/1998 | Chang et al. | 437/27 |
| 5,747,368 | * 5/1998 | Yang et al. | 438/217 |
| 5,861,330 | * 1/1999 | Baker et al. | 438/232 |
| 5,929,493 | * 7/1999 | Wu | 257/369 |
| 5,985,743 | * 11/1999 | Gardner | 438/527 |
| 6,083,797 | * 7/2000 | Wong et al. | 438/296 |
| 6,156,591 | * 12/2000 | Wu | 438/199 |

* cited by examiner

*Primary Examiner*—John F. Niebling
*Assistant Examiner*—Walter L. Lindsay, Jr.

(57) ABSTRACT

The present invention discloses a method of forming CMOS transistors with self-aligned planarization twin-well by using fewer mask counts. After a silicon nitride layer is formed over a first pad oxide layer on a semiconductor substrate, an N-well region is defined by first implanting in the semiconductor substrate. After removing the first photoresist layer, a second ion implantation is performed to define a P-well region. Next, both the silicon nitride layer and the first pad oxide layer are removed. A high temperature long time anneal is done to form a deep twin-well. A plurality of trench isolation regions is formed to define an active area region. A second pad oxide layer is formed on the substrate. A high energy and low dose blanket phosphorous is implanted in a semiconductor substrate for forming a punch-through stopping layer of the PMOSFET device. A low energy and low dose blanket $BF_2$ implant then adjust both the threshold voltages of the PMOSFET and NMOSFET. Finally, the standard processes can be employed for fabricating the CMOS transistors.

21 Claims, 4 Drawing Sheets

METHOD OF FABRICATING CMOS TRANSISTORS WITH SELF-ALIGNED PLANARIZATION TWIN-WELL BY USING FEWER MASK COUNTS

This is a continuation-in-part application of Ser. No. 09/013,424 filed Jan. 23, 1998, entitled "METHOD OF FABRICATING CMOS TRANSISTORS WITH SELF-ALIGNED PLANARIZATION TWIN-WELL BY USING FEWER MASK COUNTS".

BACKGROUND OF THE INVENTION

1. Field of the Invention

The invention relates to a method of forming a twin-well for CMOS (Complementary Metal-Oxide-Semiconductor) transistors, and more particularly, to a method of forming a self-aligned planarization twin-well for CMOS transistors by using fewer mask counts than conventional skills.

2. Description of the Prior Art

In the present days, CMOS transistors construct more and more devices because the CMOS structures offer a lot of advantages such as low power consumption than NMOS and PMOS transistors. For example, the CMOS transistors draw very little current during the transition from one state to another, and allow power consumption to be minimized. However, the aforementioned advantages are important attributes for high-density applications.

Typically, there are many technologies used to fabricate the CMOS transistors, such as p-well, n-well, and twin-well processes. As noted, the twin-well process is the most attractive scheme utilized for fabricating CMOS products because many advantages offered by the twin-well technology. The twin-well technology fabricates two separate twins to be implemented into very lightly doped silicon. This also allows the doping profiles in each twin region to be tailored independently so that neither type of device will suffer from excessive doping effects. Furthermore, the doping profile of each of the device types can be set independently since the constraint of single-well CMOS does not exist.

All persons skilled in the art know that a planar surface should be prepared before performing sequence processes of forming CMOS transistors. Unfortunately, it is difficult to obtain a true planarized self-aligned twin-well for CMOS transistors because the twin boundary has a topography height, which usually varies from 100 to 200 nm (nano meters). Under this situation with such a topography height, the current I-line lithography tools encounter severe difficulties when printing transistors with dimension below 0.35 $\mu$m. Accordingly, this disadvantage becomes a bottleneck especially for deep submicro ULSI (Ultra-Large-Scale-Integrated) applications that are the main electronic products today (please refer to "0.2-$\mu$m n-Channel and p-Channel MOSFET's Integrated on Oxidation-Planarized Twin-Tubs" in IEEE Electron Device Lett., vol., EDL-11, p. 500–502, 1996.) Also, for gate runners parallel to the topography edges, ragged lines are formed due to proximity effects in the resist exposure. Therefore, for the lithography of deep sub-micro window contact that contains more topography from the gate runners, the variation becomes even more server. A requirement has been arisen to disclose a process for overcoming the aforementioned disadvantages while fabricating CMOS transistors.

SUMMARY OF THE INVENTION

An object of the present invention is to provide a method of fabricating CMOS transistors with self-aligned planarization twin-well by using fewer mask counts.

Accordingly, the present invention discloses a method of preparing a planarized self-aligned twin-well for CMOS transistors. After a silicon nitride layer is formed over a pad oxide layer on a semiconductor substrate, an N-well region is defined by first implanting in the semiconductor substrate. After removing the first photoresist layer, a second ion implantation is performed to define a P-well region. Next, both the silicon nitride layer and the pad oxide layer are removed. A high temperature steam oxidation process is then performed to remove the crystalline defects, and the in-situ high temperature long time anneal is done to form a deep twin-well. A plurality of trenches is formed to define an active area region, and a thick oxide layer is then formed and refilled in said trenches. An etching back or CMP process is performed to remove the thick oxide layer above top surface of the substrate. A second pad oxide layer is formed on the substrate. A high energy and low dose blanket phosphorous is implanted in a semiconductor substrate for forming a punch-through stopping layer of the PMOSFET device. A low energy and low dose blanket BF2 implant then adjust both the threshold voltages of the PMOSFET and NMOS-FET. Finally, the standard processes can be employed for fabricating the CMOS transistors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
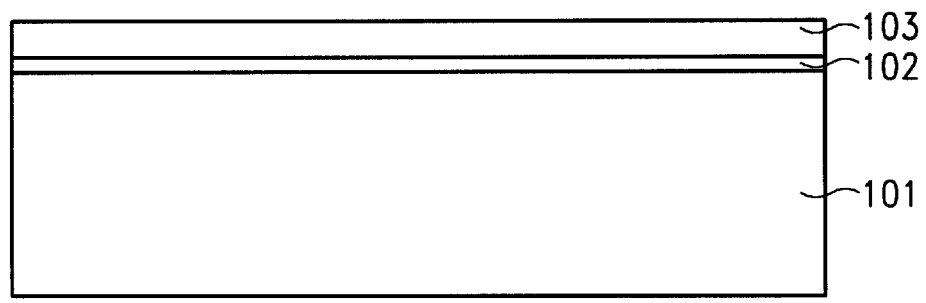
FIG. 1 is a cross-sectional view of a semiconductor substrate representative of when a silicon nitride layer is formed over a pad oxide layer on the semiconductor substrate.

The present invention discloses a method of preparing a planarized self-aligned twin-well for CMOS transistors. An N-well 108 is formed in the semiconductor substrate 101, then a P-well 109 is formed against the N-well 108, and portion of the P-well 109 is formed along the bottom of the N-well 108. A trench isolation region 111 is formed on the surface of both the N-well 108 and P-well 109, and covers portions of the N-well 108 and P-well 109. A punchthrough stopping layer 114 for the CMOS transistor is formed in the upper portion of the N-well 108. A $BF_2$ ion implantation layer 115 formed at top of both the N-well 108 and P-well 109 to increase the threshold voltages of the PMOSFET and NMOSFET transistors. A pad oxide layer is also formed to cover the top of the N-well 108 and P-well 109, and portions of the pad oxide layer are then formed to be the gate oxide layers of the PMOSFET and NMOSFET transistors. The method of the present invention is easier than a conventional process and uses fewer masks that results cost down and higher reliability.

The formation of the present invention can be seen hereinafter. FIG. 1 is a cross-sectional view of a semiconductor substrate 101 representative of when a silicon nitride layer 103 is formed over a first pad oxide layer 102. The first pad oxide layer 102 with a thickness of about 30 to 500 Å is formed on the semiconductor substrate 101. The silicon nitride layer 103 with a thickness of about 500 to 3000 Å is then deposited on the first pad oxide layer 102 by conventional deposition.

Figure 2:
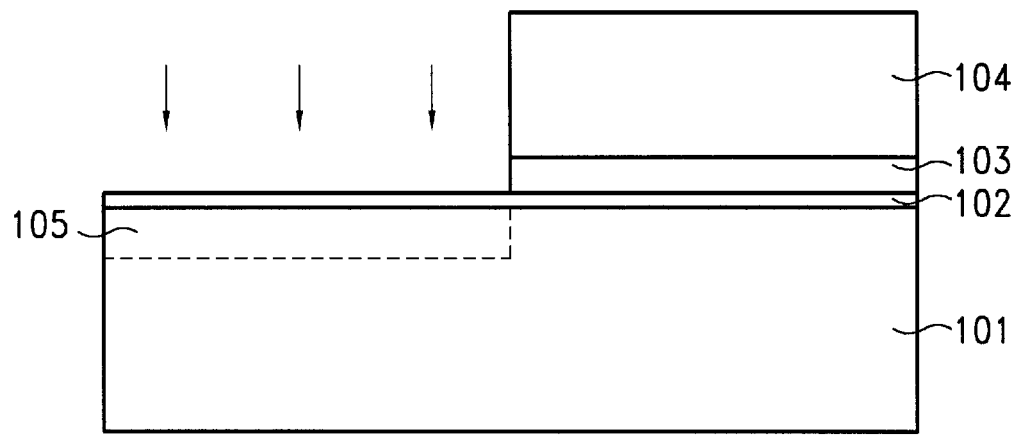
FIG. 2 illustrates a cross-sectional view of the semiconductor substrate representative of when phosphorous ions are implanted to define an n-well region in the semiconductor substrate.

Referring to FIG. 2, a first photoresist layer 104 is patterned on the silicon nitride layer 103 to define an N-well region. The exposed portion of the silicon nitride layer 103 is removed. Next, a high energy ion implantation is performed to form the N-well region 105 by using a photoresist layer 104 as a mask. The source of the ion implementation is N- (conductive) type ions, such as phosphorous or the like. The depth of the N-well 105 is about 0.1 to 1 $\mu$m. The implanted phosphorous ions are at energy about 100 to 3000 KeV and at a dose between 5E111 to 5E13 atoms/cm². The first photoresist layer 104 is then removed by ashing.

Figure 3:
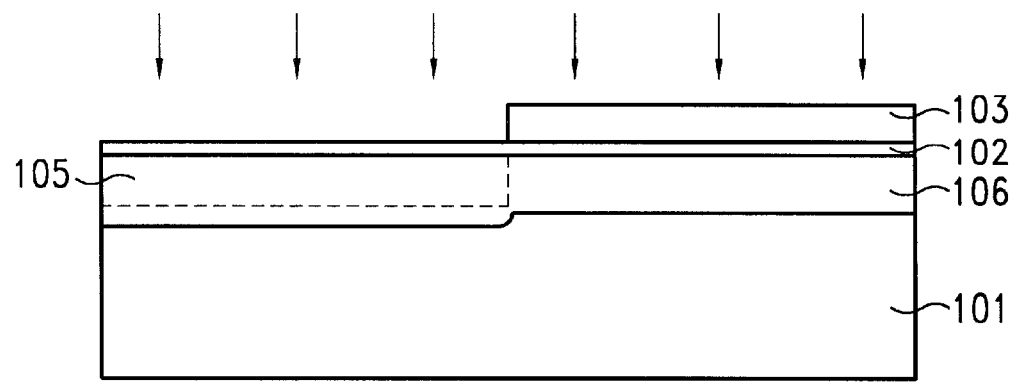
FIG. 3 represents a cross-sectional view of the semiconductor substrate illustrative of when a high energy and low dose blanket boron is implanted in a semiconductor substrate when the photoresist layer used for defining the n-well is stripped.
Figure 4:
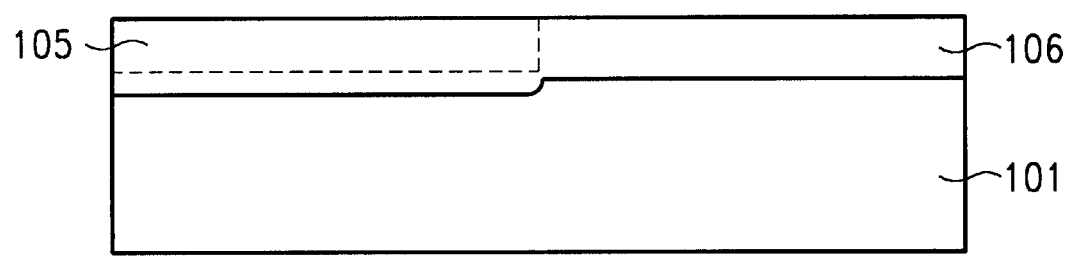
FIG. 4 demonstrates a cross-sectional view of the semiconductor substrate illustrative of when the silicon nitride layer and the pad oxide layer are completely removed.

After the photoresist 104 is stripped, a high energy and low dose blanket implantation is performed to form a doped region 106 against the N-well region 105. Typically, the doped region 106 is formed by implanting p-type ions such as boron or the like. FIG. 3 illustrates a cross-sectional view of the semiconductor substrate 101 after the doped region 106 is formed. The doped boron ions are at energy about 100 to 3000 KeV and at a dose between 5E11 to 5E13 atoms/cm². The silicon nitride layer 103 and the first pad oxide layer 102 are then removed, and the cross-sectional view of the semiconductor substrate 101 when the nitride layer 103 and the first pad oxide layer 102 are completely removed is demonstrated in FIG. 4.

Figure 5:
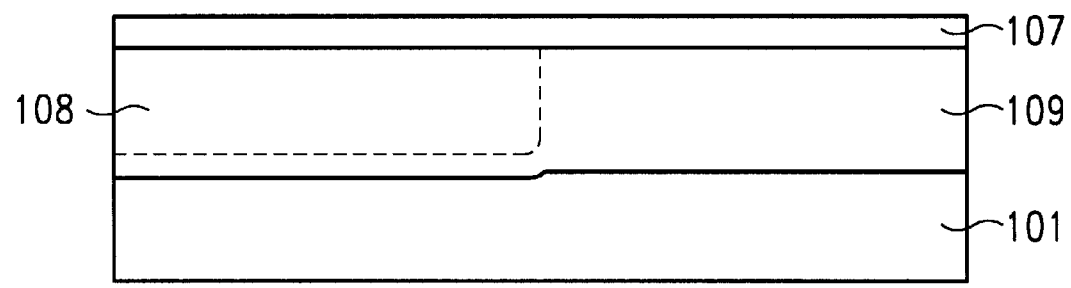
FIG. 5 shows a cross-sectional view of the semiconductor substrate illustrative of when a high temperature wet oxidation is performed to remove crystalline defects and then in-situ anneal.

Referring to FIG. 5, which represents a cross-sectional view illustrative of when a high temperature steam oxidation is performed to eliminate surface crystalline defects. Furthermore, the in-situ high temperature anneal is performed long enough to form a deep twin-well encompassing an N-well 108 and a P-well 109. The temperature is about 800° C. to 1150° C. An oxide layer 107 with a thickness of about 200 to 1000 Å is also grown on the surface of the semiconductor substrate 101 due to the oxidation.

Figure 6:
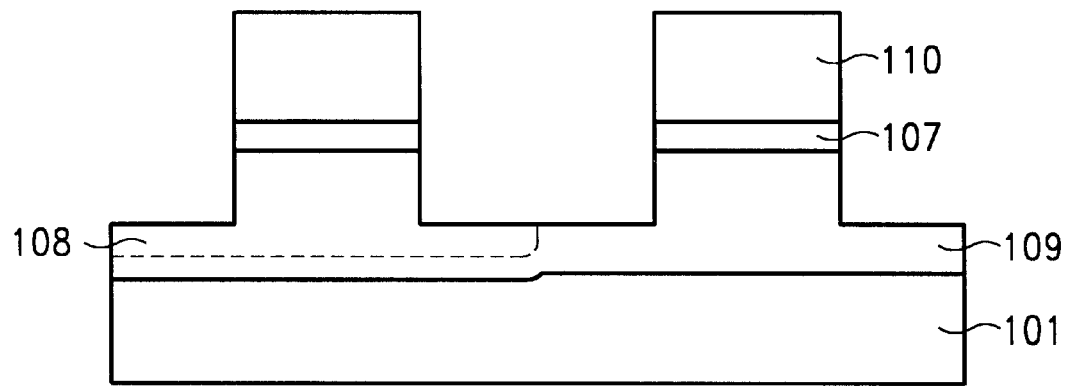
FIG. 6 is a cross-sectional view of the semiconductor substrate illustrative of pattering a second photoresist layer to define the active area and then etching the semiconductor substrate to forming a plurality of trenches.

Next, the processes for defining active regions can be continued. Referring to FIG. 6, a second photoresist layer 110 is patterned over the thick oxide layer 107 on the semiconductor substrate 101 to define the active regions. With the second photoresist layer 110 as a mask, a conventional dry etching process is performed to etch the thick oxide layer 107, portion of the N-well 108 and P-well 109. A plurality of trenches is then formed in the semiconductor substrate 101. The depth of the plurality of trenches is about 2000 Å to 10000 Å from the top surface of the semiconductor substrate 101. The second photoresist layer 110 is then removed by ashing.

Figure 7:
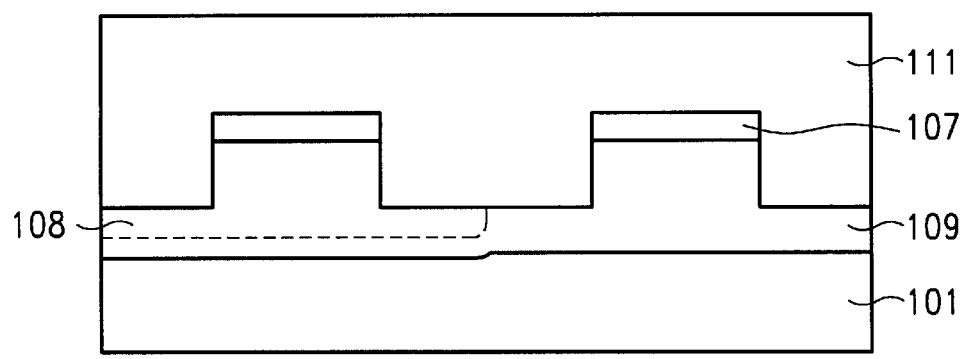
FIG. 7 shows a cross-sectional view of the semiconductor substrate illustrative of depositing a thick CVD oxide layer and filling in the trenches after stripping the second photoresist layer.

Referring to FIG. 7, a TEOS oxide layer 111 is deposited on the semiconductor substrate and refilled in the plurality of trenches by chemical vapor deposition. The TEOS CVD oxide layer 111 has a good conformable deposition on the surface of the semiconductor substrate 101 and good step coverage in the trenches. The thickness of the TEOS CVD oxide is about 3000 Å to 10000 Å. In a preferred embodiment, a thermal oxidation in dry $O_2$ ambient is performed with a thickness about 24 nm in the surface of the trenches. The thin thermal oxide layer (not shown) acts as an adhere layer for subsequent oxide deposition.

Figure 8:
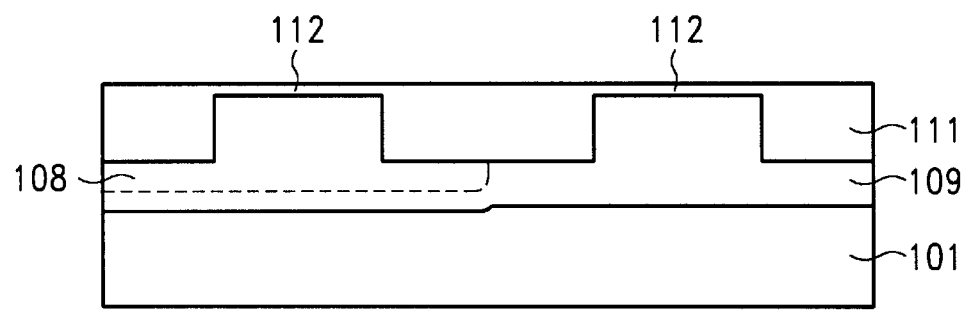
FIG. 8 shows a cross-sectional view of the semiconductor substrate illustrative of etching back the thick oxide layer and the thick pad oxide layer to the semiconductor substrate and then regrowing a thin gate oxide film.

A high temperature densification process is performed to make the TEOS CVD oxide layer 111 more resistant against oxide etching or polishing. The temperature of the densification process is about 800 to 1100° C. An etching back is performed to the top surface of the semiconductor substrate 101 and formed a plurality of trench isolation regions in the N-well 108 and P-well 109. A chemical mechanical polishing process is also used for removing the TEOS CVD oxide above the top surface of the semiconductor substrate 101. Then, two kinds of cleaning processes are performed separately. The first one is an HF cleaning method which is to make the silicon surface hydrophobic and the other one is $H_2O_2$ cleaning method for hydrophilic silicon surface. A second pad oxide layer 112 has a thickness about 100 Å to 300 Å. FIG. 8 depicts a cross-sectional view of the semiconductor substrate 101 after a thermal oxidation is applied to grow a second pad oxide layer 112 on the semiconductor substrate 101.

Figure 9:
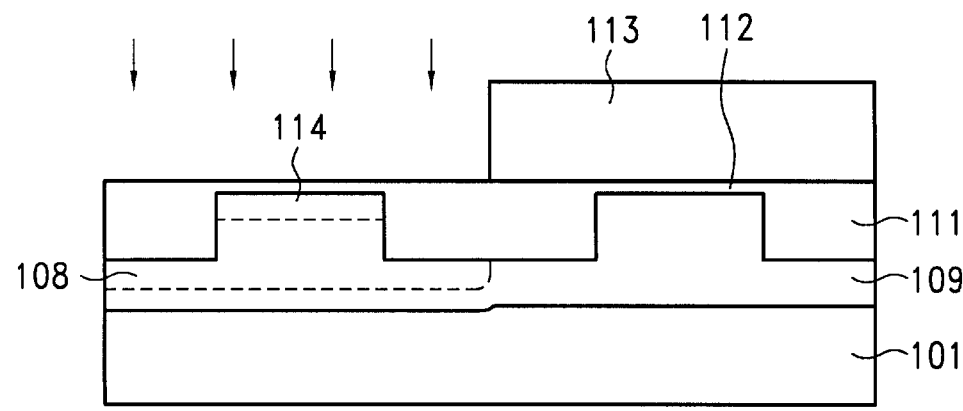
FIG. 9 represents a cross-sectional view of the semiconductor substrate illustrative of implanting a second high energy and low dose blanket phosphorous in a semiconductor substrate for punch-through stopping layer by the third photoresist layer as a mask.

Please referring to FIG. 9, which illustrates a cross-sectional view when a third photoresist layer 113 is patterned on the semiconductor substrate 101 to expose the N-well 108. Then, a punch-through stopping layer 114 for the PMOSFET is formed in the semiconductor substrate 101. Typically, the punch-through stopping layer 114 is formed by implanting a high energy and low dose blanket phosphorus and in accompanied with the third photoresist layer 113 as a mask. The implanted phosphorus ions are at energy about 100 to 300 KeV and at a dose between 5E11 to 5E13 atoms/cm².

Figure 10:
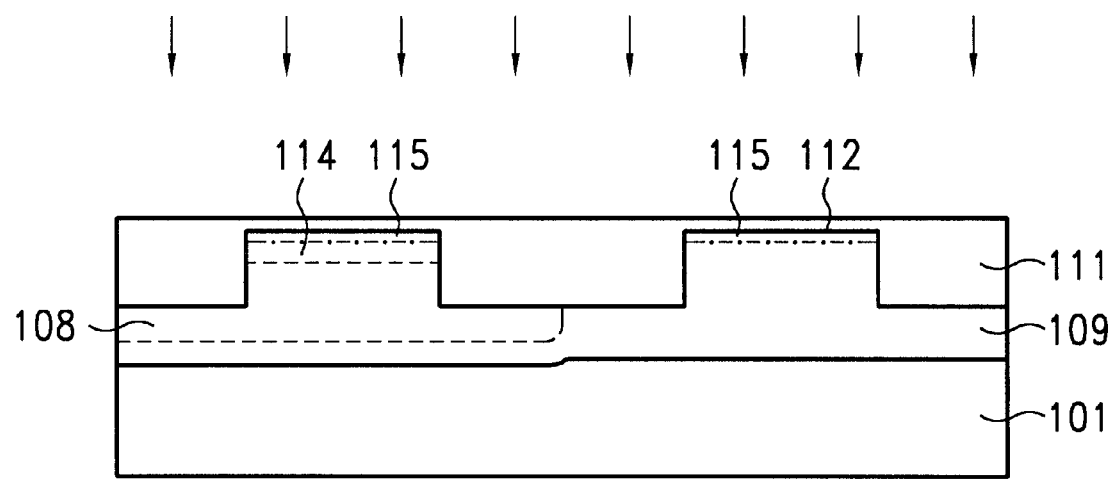
FIG. 10 shows a cross-sectional view of the semiconductor substrate representative of performing a low energy and low dose $BF_2$ ion implantation to the semiconductor substrate after stripping the third photoresist layer.

Finally, a planarized twin-well for CMOS transistor is formed after a low energy and low dose $BF_2$ ion implantation is performed for adjusting the threshold voltages of both the NMOSFET and PMOSFET. FIG. 10 shows a cross-sectional representative of when the low energy and low $BF_2$ ion implantation is performed to form an adjusting layer 115 that adjusts the threshold voltage of the CMOS transistors.

The implanted $BF_2$ ions are at energy about 10 to 150 KeV and at a dose between 1E12 to 1E14 atoms/cm$^2$.

It is obvious that planarization topography between N-well and P-well can be easily obtained. In addition, there are fewer masks required in the invention when compared with conventional CMOS technology because those masks used for p-well implant, channel stop implant, P-Vt (threshold voltage of PMOS) and N-Vt (threshold voltage of NMOS) implants can be eliminated. Moreover, traditional recipe is manufacturable for the present invention.

Figure 11:
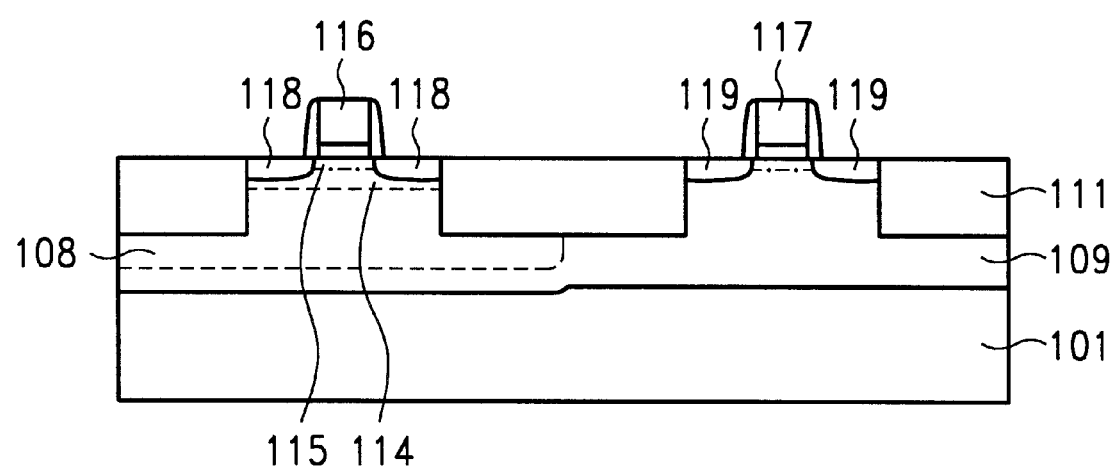
FIG. 11 is a cross-sectional view of the semiconductor substrate when a CMOS transistor is fabricated on the semiconductor substrate.

When the isolation regions are completely made for semiconductor devices, sequence processes for fabricating CMOS transistors are thus continued. For example, in FIG. 11 that shows a cross-sectional view illustrative of when a gate structure 116, and source and drain 118 are formed for the PMOSFET, and a gate structure 117, and source and drain 119 are formed for the NMOSFET.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a twin-well CMOS (Complementary Metal-Oxide-Semiconductor) transistor with reducing masks, said method comprising the steps of:

forming a first pad oxide layer on a semiconductor substrate;

forming a nitride layer on said first pad oxide layer;

patterning a first photoresist layer to define a first well region;

performing a first ion implantation in said first well region by using said first photoresist layer as a mask;

removing said first photoresist layer;

performing a second ion implantation in said substrate to define a second well region;

removing said nitride layer and said first pad oxide layer;

performing a high temperature process on said substrate to form a deeper twin-well;

forming a plurality of trenches in said substrate to define an active area region;

forming an thick oxide layer on said substrate and filling in said trenches;

etching back said thick oxide layer to a top surface of said substrate;

forming a second pad oxide layer on said substrate;

patterning a second photoresist layer to expose said first well region;

performing a third ion implantation in said first well region to form a punch-through stopping layer;

removing said second photoresist layer;

performing a fourth ion implantation to adjust a voltage threshold of said CMOS transistor; and forming said CMOS transistor on said first well region and said second well region.

2. The method according to claim 1, wherein a step of etching back portion of said first silicon nitride layer to expose portion of said first pad oxide layer is performed before performing said first ion implantation.

3. The method according to claim 1, wherein said first ion implantation is doped phosphorous ions at an energy between about 100 to 3000 KeV, at a dose between about 5E11 to 5E13 atoms/cm$^2$.

4. The method according to claim 1, wherein said trench has a depth from the top surface of said substrate about 2000 to 10000 Å.

5. The method according to claim 1, wherein said thick oxide layer is formed by chemical vapor deposition (CVD).

6. The method according to claim 1, wherein said thick oxide layer is formed of TEOS.

7. The method according to claim 1, wherein a densification process is performed before etching back said thick oxide layer.

8. The method according to claim 1, wherein said second ion implantation performs a boron blanket implantation at an energy between about 100 to 3000 KeV, at a dose between about 5E11 to 5E13 atoms/cm$^2$.

9. The method according to claim 1, wherein said third ion implantation is doped phosphorous ions at an energy between about 100 to 300 KeV, at a dose between about 5E11 to 5E13 atoms/cm$^2$.

10. The method according to claim 1, wherein said fourth ion implantation is doped $BF_2$ ions at an energy between about 10 to 150 KeV, at a dose between about 1E12 to 1E14 atoms/cm$^2$.

11. A method of forming a twin-well CMOS (Complementary Metal-Oxide-Semiconductor) transistor with reducing masks, said method comprising the steps of:

forming a first pad oxide layer on a semiconductor substrate;

forming a nitride layer on said first pad oxide layer;

patterning a first photoresist layer to define a first well region;

performing a first ion implantation in said first well region by using said first photoresist layer as a mask;

removing said first photoresist layer;

performing a second ion implantation in said substrate to define a second well region;

removing said nitride layer and said first pad oxide layer;

performing a high temperature process on said substrate to form a deeper twin-well;

forming a plurality of trenches in said substrate to define an active area region;

forming an thick oxide layer on said substrate and filling in said trenches;

performing a chemical mechanical polishing process to a top surface of said substrate;

forming a second pad oxide layer on said substrate;

patterning a second photoresist layer to expose said second well region;

performing a third ion implantation in said first well region to form a punch-through stopping layer;

removing said second photoresist layer;

performing a fourth ion implantation to adjust a voltage threshold of said CMOS transistor; and forming said CMOS transistor on said first well region and said second well region.

12. The method according to claim 11, wherein a step of etching back portion of said first silicon nitride layer to expose portion of said first pad oxide layer is performed before performing said first ion implantation.

13. The method according to claim 11, wherein said first ion implantation is doped phosphorous ions at an energy between about 100 to 3000 KeV, at a dose between about 5E11 to 5E13 atoms/cm$^2$.

14. The method according to claim 11, wherein said trench has a depth from the top surface of said substrate about 2000 to 10000 Å.

15. The method according to claim 11, wherein said thick oxide layer is formed by chemical vapor deposition (CVD).

16. The method according to claim 11, wherein said thick oxide layer is formed of TEOS.

17. The method according to claim 11, wherein a densification process is performed before performing a chemical mechanical polishing process.

18. The method according to claim 11, wherein a HF cleaning process is performed after performing a chemical mechanical polishing process.

19. The method according to claim 11, wherein said second ion implantation performs a boron blanket implantation at an energy between about 100 to 3000 KeV, at a dose between about 5E11 to 5E13 atoms/cm$^2$.

20. The method according to claim 11, wherein said third ion implantation is doped phosphorous ions at an energy between about 100 to 300 KeV, at a dose between about 5E11 to 5E13 atoms/cm$^2$.

21. The method according to claim 11, wherein said fourth ion implantation is doped $BF_2$ ions at an energy between about 10 to 150 KeV, at a dose between about 1E12 to 1E14 atoms/cm$^2$.

* * * * *